United States Patent [19] [11] 3,916,515
Walsh et al. [45] Nov. 4, 1975

[54] METHOD OF PRODUCING PRINTED CIRCUIT BOARD IN MULTIPLE UNITS

[75] Inventors: Matthew John Walsh, Lachine; Frederick Luis Gaiser, Otterburn Park; Robert Normand Marcotte, Laval des Rapides, all of Canada

[73] Assignee: Northern Electric Company, Montreal, Canada

[22] Filed: Sept. 26, 1974

[21] Appl. No.: 509,486

[52] U.S. Cl. ........................ 29/626; 83/25; 83/108; 317/101 CC
[51] Int. Cl.[2] ........................ H05K 3/34
[58] Field of Search ............ 29/624, 625, 626, 628, 29/629, 630 R, 484, 488–491, 497.5, 498, 499, 190, 203 B; 174/68.5; 317/101 B, 101 C, 101 CC; 117/5.5, 6; 83/108, 25

[56] References Cited

UNITED STATES PATENTS

| | | | |
|---|---|---|---|
| 2,783,193 | 2/1957 | Nieter | 83/25 X |
| 3,610,082 | 10/1971 | Riggi et al. | 83/108 |
| 3,767,282 | 10/1973 | Poley et al. | 29/490 X |
| 3,780,431 | 12/1973 | Feeney | 174/68.5 X |
| 3,811,187 | 5/1974 | Diel et al. | 29/630 R |

*Primary Examiner*—C. W. Lanham
*Assistant Examiner*—Joseph A. Walkowski
*Attorney, Agent, or Firm*—Sidney T. Jelly

[57] ABSTRACT

Printed circuit boards, after printing and shearing from a sheet of material, are returned to the sheet, the sheets and returned boards heated to a predetermined temperature and weighted while cooled. The boards can then have components added — by hand or by machine insertion. Wave soldering can also be carried out before individual boards are pressed out of the sheet. The material used is generally a fibre reinforced synthetic resin and in particular a thermo setting resin is used but which has a particular characteristic of being slightly thermo plastic over a restricted range of elevated temperatures.

5 Claims, 3 Drawing Figures

METHOD OF PRODUCING PRINTED CIRCUIT BOARD IN MULTIPLE UNITS

This invention relates to a method of producing printed circuit boards in multiple units.

The use of printed circuit boards is very widespread and is in many industries. The mounting of components on such boards can be by hand, but machine insertion of the components is preferred, both for rate of output and reduction of labour costs. There is also the avoidance of possible mounting errors.

While relatively large printed circuit boards can economically be handled singly, it becomes less economic for small boards. To make the most efficient use of a component insertion machine ideally several small boards are mounted on the machine at one time. This necessitates jigs or other structures for holding the boards and assembly in the jigs is time consuming and relatively slow. The jigs are expensive and do not normally permit the loading of as many boards as could be operated on by the machine because of holding clamps and similar items.

After assembly of the components to the boards, the connections are usually wave soldered and again while large boards can be handled singly it would be more economic to handle smaller boards a number at a time. This requires holding fixtures which require labour for putting boards in the holding fixtures and the fixtures themselves present problems.

The present invention provides a method of producing printed circuit boards in which the boards, while having been printed and also sheared from a sheet of material, are retained in position in the sheet of material, without additional holding or fixing means, while component insertion, and wave soldering, is carried out. Particularly, the board material is a glass-fibre reinforced synthetic resin, and the resin can have a particular characteristic in that although nominally thermo-setting, it is slightly thermo plastic over a restricted range of elevated temperatures.

The method of the invention comprises shearing individual boards from a sheet of material after the circuits have been produced on the individual boards, returning the boards into the apertures in the sheet of material, heating the sheets and returned boards to a predetermined temperature and weighting the sheets to maintain flatness while cooling. After cooling, components are mounted, and connections wave soldered, as required. The individual boards are then pushed out of the sheet of material.

The invention will be readily understood by the following description of a particular embodiment, by way of example, in conjunction with the accompanying drawings, in which:-

Figure 1:
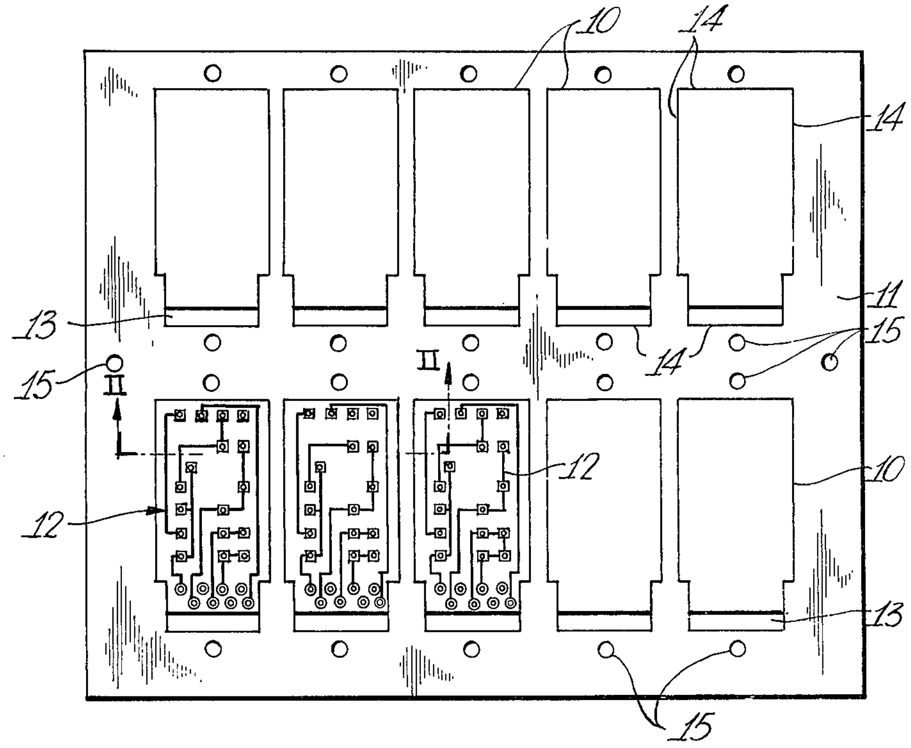
Figure 2A:
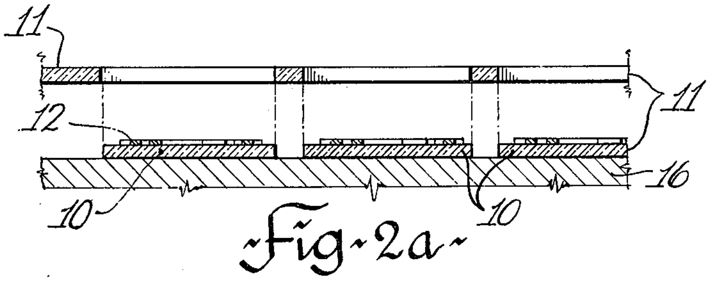
Figure 2B:
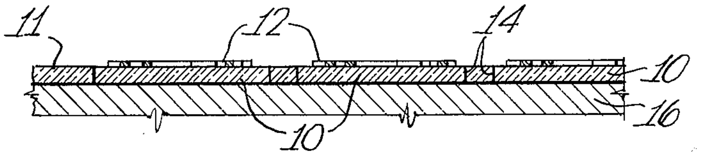

FIG. 1 is a plan view of a sheet of material with manufacturing and locating holes punched and individual printed circuit boards punched out and returned;

FIGS. 2*a* and 2*b* are cross-sections through a sheet on the line II—II of FIG. 1 illustrating the consecutive position of boards after punching from the sheet and return to the sheet.

As illustrated in FIG. 1 a plurality of individual printed circuit boards 10 are formed from a sheet of glass-fibre reinforced synthetic resin 11. Each board 10 has a printed circuit thereon, drawn diagramatically at 12. For convenience in handling an aperture 13 is usually punched out at one end of each board. The periphery of each board 10 is delineated at 14 and this is the shear line of punching out each board 10.

Manufacturing and locating holes 15 are also punched in the sheet 11.

The method of producing the boards 10 is generally as follows although it will be appreciated that variations in the method can be made to meet varying requirements. Starting with the basic glass-fibre reinforced material, the sheet 11 is cut to size. The holes 15 are then punched. This is followed by the punching out of the windows or apertures 13, if such apertures are required. The printed circuits 12 are then formed by conventional means such as by coating the boards 10 with copper, masking, and etching. Using the holes 15 as locating means, the boards 10 are then punched out of the sheet. The punch press is such that after punching out the boards to a position as in FIG. 2a, the spring loaded platen beneath the sheet 11, indicated at 16, returns the boards 10 and pushes them back into the apertures left in the sheet. In a sheet as in FIG. 1, the boards 10 on one edge can be punched and returned at a first punching operation and then the sheet turned round and the boards on the other edge punched and returned. The number, and disposition, of boards punched out at a time will depend largely on press capacity, and also the size of tool it is desired to make.

After punching and return of the boards, the sheet is bowed, partly due to the strains arising from the punching operation. The sheets are stacked and put into a heating furnace, where the stack is held at a predetermined temperature for a time sufficient to ensure that the stack is heated right through. During heating the sheets are weighted to flatten them. The stack is then removed from the furnace and cooled, still weighted.

After cooling, a coating of alcohol wood rosin is usually applied over the side on which is printed the circuits, to protect the copper circuitry. The sheets, with the boards in situ are then passed to the assembly stations. The components can be assembled to the boards 10 by hand or by automatic component insert machines. There may be both automatic insertion and hand assembly. Following assembly the integral sheets are then passed to the wave soldering machines where the contacts between component leads and printed circuits are soldered.

Following wave soldering further assembly or other operations may or may not be carried out on the boards. The boards are removed from the sheets by a simple press which pushes on the boards while the surrounding frame or skeleton is held stationary. The boards may be in a completely finished state or further assembly or other work may be carried out.

When the individual boards 10 are sheared from the sheet 11, due to the characteristics of the material there is some crumbling at the shear lines — the shearing is not completely clean and sharp. As the boards are pushed back, or returned, into their previous positions in the sheet, much of these crumbs are also pushed back into the shear line. It is thought that the slight softening of these crumbs, and the synthetic resin, during the heating of the sheets and boards aids in providing some "adhesion" between boards and the sheet frame or skeleton. The term "adhesion" is used in a general sense as there is not a fusion or welding, but the slightly rough edges of the shear line, and the crumbs, create a high level of frictional interference and stickiness during softening.

The thickness of the basic sheet has some effect on the strength of the bond between the returned or reinserted boards. The thinner the material the weaker the join and it has been found that thicknesses of 0.050 inches and thicker provide effective joints, although thinner material can be used in some instances where minimal loads occur on the boards after return.

As stated, the particular characteristic of the synthetic resin appears to have an advantageous effect on joint effectiveness. A resin having some slight thermo-softening at some range of temperature gives improved joints, presumably because the slight softening causes some minor movement or intermingling of the rough edges and compression of the loose crumbs into any gaps in the shear line. While such a joint is strong enough to support the boards in the sheet during assembly and other operations, it is readily broken when it is desired to remove the boards from the sheet.

A particular synthetic resin which has been found suitable is a bis-chloro-phenyl A resin. This has slight softening in the range of about 145° to 180°. This is the temperature range within which the printed and punched sheets are heat treated. A thickness of 0.062 inch — one of the standard thicknesses of base sheet material — is very effective, and thicker material is also very good, the thickness being set by press capacity, strength requirement of the finished board and cost.

As an added feature, the alcohol wood rosin coating applied to the board to protect the copper circuit from oxidization also can assist in improving the strength of the joint between returned board and sheet in that some of the rosin permeates into the joint line, acting to some content like a glue.

Considerable cost savings occur with the use of the present invention. In particular cases, savings of up to 30% in the cost of our assembled and soldered board have been obtained.

What is claimed is:

1. A method of producing printed circuit boards in multiple units, the boards carrying electrical components, comprising;

shearing individual boards, each board having a circuit thereon, from a sheet of glass fibre impregnated with synthetic resin, to leave apertures in said sheet, the sheet having a thickness greater than 0.050 inch;

returning the sheared boards into said apertures in said sheet;

stacking a plurality of sheets and returned boards and heating to a predetermined temperature and cooling, while weighted, to flatten the sheets and returned boards;

mounting said components on the boards while retained in the sheets;

soldering the components to the related circuit.

2. A method as claimed in claim 1, wherein the components are wave soldered to the related circuit.

3. A method as claimed in claim 1, including pressing out the individual boards after soldering the components.

4. A method as claimed in claim 1, wherein said resin impregnating the glass fibre material is a thermosetting resin having a thermo-plastic characteristic over a restricted range of elevated temperatures, and said sheets and returned boards are heated to and cooled from said restricted range of elevated temperatures while weighted.

5. A method as claimed in claim 1 including coating the sheet and returned boards with a layer of alcohol wood rosin on the side on which are printed the circuits.

* * * * *